United States Patent [19]

Colombo

[11] 4,277,730
[45] Jul. 7, 1981

[54] VOLTAGE LIMITER FOR FLYBACK GENERATOR OF TELEVISION SWEEP SYSTEM

[75] Inventor: Antonio Colombo, Tradate, Italy

[73] Assignee: SGS-ATES Componenti Elettronici S.p.A, Agrate Brianza, Italy

[21] Appl. No.: 60,344

[22] Filed: Jul. 25, 1979

[30] Foreign Application Priority Data

Jul. 26, 1978 [IT] Italy .................. 26119 A/78

[51] Int. Cl.$^3$ .................. H01J 29/70; H01J 29/76
[52] U.S. Cl. .................. 315/408
[58] Field of Search .................. 315/396, 397, 408, 411

[56] References Cited

PUBLICATIONS

A. Romano, *A Monolithic Integrated Circuit for Vertical Deflection in Television Receivers*, Presented 1973, Published 1975 by Transactions CE.

*Primary Examiner*—Theodore M. Blum
*Attorney, Agent, or Firm*—Karl F. Ross

[57] ABSTRACT

A flyback generator for a television receiver, in a sweep system driving the vertical-deflection yoke of a cathode-ray tube, comprises a storage capacitor with a low-voltage side grounded through a charging transistor and a high-voltage side connected through an isolating diode to the live terminal of a d-c supply. The charging transistor conducts during scanning but is cut off during flyback by the operation of a first switching transistor while a second switching transistor connects the low-voltage side of the charged storage capacitor to the live supply terminal whereby its high-voltage side is carried to a voltage $V_f$ equaling twice the supply voltage $V_s$, less any voltage drop across the charging transistor. This high-voltage side is connected to the yoke through an output stage of a power amplifier saturated during flyback. The coupling between the first switching transistor and the charging transistor comprises a voltage-regulating network including a Zener diode connected across the supply; when the supply voltage $V_s$ rises above a threshold $V_t$ established by the Zener diode, a branch current mirroring the Zener current reduces the conductivity of the charging transistor to generate during scanning a voltage $V_s = 2(V_s - V_t)$ thereacross which results in a partial discharge of the storage capacitor; thus, the maximum $V_F$ of the flyback voltage $V_f$, occurring upon switchover, is twice the threshold voltage $V_t$.

5 Claims, 2 Drawing Figures

VOLTAGE LIMITER FOR FLYBACK GENERATOR OF TELEVISION SWEEP SYSTEM

FIELD OF THE INVENTION

My present invention relates to a circuit arrangement for limiting the flyback voltage applied by a sweep system to a delection yoke of a cathode-ray tube in a television receiver.

BACKGROUND OF THE INVENTION

In an article by A. Romano and L. Venutti presented at the 1973 Chicago Fall Conference of Consumer Electronics, published February 1975 by TRANSACTIONS CE, there has been described an integrated circuit for the vertical deflection of a television receiver in which a flyback generator doubles the available supply voltage of a d-c source for the purpose of shortening the flyback period. This is accomplished with the aid of a storage capacitor whose low-voltage side is grounded through a charging transistor and whose high-voltage side is connected through an isolating diode to the live supply terminal, the beginning of that flyback period giving rise to a reverse voltage from the deflection yoke which switches several transistors to cut off the previously saturated charging transistor and to connect the low-voltage side of the storage capacitor directly to the supply terminal. Since the capacitor has acquired during the scanning period a charging voltage $V_c$ practically equal to the supply voltage $V_s$, the switchover provides at the high-voltage side a flyback potential $V_f = 2 V_s$ which is applied to the yoke via a saturated output transistor of a power amplifier driven by an oscillator. A voltage stabilizer, including a Zener diode, establishes a constant biasing potential for certain transistors but has no effect upon the capacitor charge.

If the supply voltage $V_s$ is subject to significant fluctuations, the flyback voltage $V_f$ may attain objectionably high values in such a system.

OBJECT OF THE INVENTION

The object of my present invention, therefore, is to provide means in a sweep system of the aforedescribed type for effectively limiting the flyback voltage to a predetermined maximum regardless of the actual value of the supply voltage.

SUMMARY OF THE INVENTION

I realize this object, in accordance with my present invention, by the provision of voltage-regulating means connected across the d-c source for controlling the conduction of the charging transistor during the scanning periods in response to fluctuations of the supply voltage whereby the charging voltage $V_c$ of the capacitor in series with that transistor is diminished by a voltage drop $V_l$ developed across that transistor.

Pursuant to a more particular feature of my invention, the voltage-regulating means comprises a current-amplifying network which establishes a theshold voltage $V_t$ and maintains the charging transistor saturated during each scanning period as long as $V_s \leq V_t$. The network includes impedance means so dimensioned as to make the voltage drop $V_l$ substantially equal to $2(V_s - V_t)$ whenever the supply voltage exceeds the threshold voltage whereby the flyback potential $V_f$ is prevented from exceeding a value of about $2 V_t$.

BRIEF DESCRIPTION OF THE DRAWING

The above and other features of my invention will now be described in detail with reference to the accompanying drawing in which.

SPECIFIC DESCRIPTION

Figure 1:
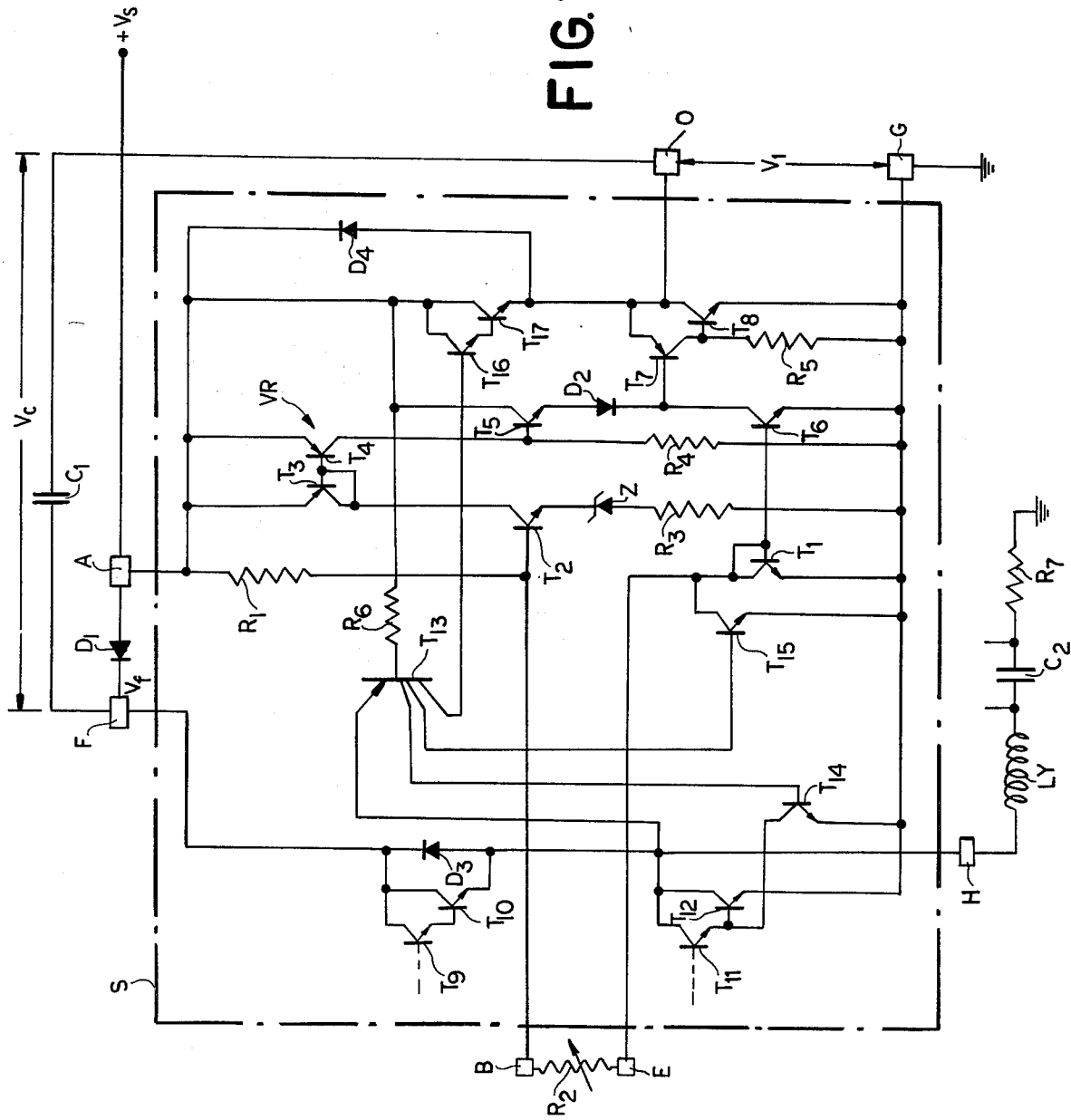
FIG. 1 is a diagram of part of an integrated circuit including a flyback generator according to my invention.

In FIG. 1 I have shown a semiconductor chip S, similar to that illustrated in the above-identified article by Romano and Venutti, incorporating most of the elements of a sweep circuit designed to control a vertical-deflection yoke LY of a conventional picture tube of a television receiver. The oscillator of the sweep circuit, synchronized by external pulses, has been omitted along with the ramp generator driven thereby and other conventional circuit components. An associated power amplifier, however, has been represented by pilot and output transistors $T_9$, $T_{10}$ and $T_{11}$, $T_{12}$ of its final stage.

The chip S is provided with a number of terminals joined to external circuit elements, i.e. a terminal A connected to one pole (here assumed to be positive) of a d-c source furnishing a supply voltage $+V_s$, a grounded terminal G constituting the other pole of the source, a terminal F linked with terminal A by an isolating diode $D_1$, a terminal O coupled to terminal F through a storage capacitor $C_1$, two terminals B and E interconnected by an adjustable resistor $R_2$, and a further terminal H tied to the yoke LY which is connected to ground through a series capacitor $C_2$ and a resistor $R_7$. Elements $C_2, R_7$ form part of a feedback network not further illustrated.

The conventional constituents of my improved flyback generator, incorporated in chip S, include a charging transistor $T_8$ connected between terminals O and G so as to lie in series with capacitor $C_1$, a control transistor $T_{13}$ with an emitter connected to the junction of output transistors $T_{10}, T_{12}$, a diode $D_3$ inserted in antiparallel relationship with transistor $T_{10}$ between that junction and terminal F, a blocking transistor $T_{14}$ in series with pilot transistor $T_{11}$, and two switching transistors $T_{15}, T_{16}$, the latter being coupled to another transistor $T_{17}$ in a Darlington configuration. Transistors $T_{14}, T_{15}$ and $T_{16}$ have their bases tied to respective collectors of control transistor $T_{13}$ whose own base is connected via a resistor $R_6$ to supply terminal A; transistor $T_{17}$ is bridged by a further diode $D_4$ in antiparallel relationship therewith.

As explained in the above-identified article, the end of the scanning period is marked by a cutoff of transistor $T_{12}$; the yoke current, which up to this point has flown through that transistor from sweep capacitor $C_2$ to ground, now passes from terminal H through diode $D_3$, storage capacitor $C_1$ and diode $D_4$ to supply terminal A. With the emitter of control transistor $T_{13}$ now more positive than its base, transistors $T_{14}, T_{15}$ and $T_{16}$ are turned on with resulting saturation of transistor $T_{17}$ whereby terminal O is directly connected to terminal A. The conduction of switching transistor $T_{15}$ cuts off the previously saturated transistor $T_8$ through which capacitor $C_1$ has been charged via the forward resistance of diode $D_1$ in a low-impedance path to substantially the supply voltage $V_s$. Since the charging voltage $V_c \approx V_s$ lies now in series with the supply voltage, terminal F has a potential of substantially $+2\,V_s$. This quickly brings to a halt the aforedescribed flow of yoke current and, with transistor $T_{10}$ saturated, lets the current pass through the yoke LY in the opposite direction as the capacitor $C_1$ discharges in a path including capacitor $C_2$, resistor $R_7$, source terminals G, A and transistor $T_{17}$. When this current begins to diminish, control transistor 13 ceases to conduct and cuts off the several blocking and switching transistors $T_{14}, T_{15}$ and $T_{16}$; this also turns off the voltage-doubling transistor $T_{17}$ and, with charging transistor $T_8$ again saturated, restores the sweep circuit to its scanning mode.

Switching transistor $T_{15}$ and charging transistor $T_8$ are the counterparts of two transistors (Q34 and Q37) described in the above-identified article which in the known system are directly interconnected to saturate the charging transistor when the switching transistor is turned off, and vice versa. In accordance with my present improvement, a voltage-regulating network VR is interposed between transistors $T_{15}$ and $T_8$ to modify the conduction of the latter during the scanning period in the event that the supply voltage $V_s$ exceeds a threshold $V_t$ closely related to the breakdown potential $V_z$ of a Zener diode Z.

Network VR has several parallel branches inserted between supply terminals A and G, one of these branches including the Zener diode Z in series with a resistor $R_3$, an NPN transistor $T_2$ and a PNP transistor $T_3$ while another branch comprises a similar PNP transistor $T_4$ in series with a resistor $R_4$. Transistors $T_3$ and $T_4$ form a current-mirror pair with interconnected bases, a similar pair being constituted by two NPN transistors $T_1$ and $T_6$ lying in two further network branches. Transistor $T_1$ is connected across the d-c source in series with a resistor $R_1$ and an adjustable external resistor $R_2$ lying between terminals B and E. Its mate $T_6$ is in series with a protective diode $D_2$ and another NPN transistor $T_5$. Switching transistor $T_{15}$, also of NPN type, is connected across current-mirror transistor $T_1$; the junction between diode $D_2$ and the collector of transistor $T_6$ is tied to the base of a PNP transistor $T_7$ whose emitter/collector path bridges the collector and base of charging transistor $T_8$, that base being connected to ground through a resistor $R_5$.

As long as supply voltage $+V_s$ lies below the threshold, Zener diode Z does not conduct so that transistors $T_2$, $T_3$, $T_4$ and $T_5$ are cut off. With switching transistor $T_{15}$ in its nonconductive state, transistors $T_1$ and $T_6$ are turned on. The collector current of transistor $T_6$, reflecting the current which passes through transistor $T_1$, is drawn from the base of transistor $T_7$ whereby the latter conducts to saturate the charging transistor $T_8$. This corresponds to the mode of operation of the known system during the scanning period. When flyback begins and transistor $T_{15}$ saturates, the bases of transistors $T_1$ and $T_6$ are effectively grounded with resulting cutoff of transistors $T_7$ and $T_8$. Simultaneously the Darlington pair $T_{16}, T_{17}$ is switched on whereby terminal F is driven to substantially $+2\,V_s$ as described above.

Let us now assume that, during the scan, the supply voltage $+V_s$ rises above the threshold $V_t$ so that Zener diode Z breaks down. Transistor $T_2$ then carries current of a magnitude determined by the supply voltage and by the biasing voltage applied to its own base by the resistors $R_1$ and $R_2$ which form a voltage divider in series with transistor $T_1$. This current traverses the transistor $T_3$ and gives rise to a similar current in its twin $T_4$ whereby transistor $T_5$ is turned on and reduces the conduction of ancillary transistor $T_7$ and charging transistor $T_8$. Thus, the voltage drop $V_l$ developed across this latter transistor rises from near zero to a significant value which, with proper dimensioning of the several network resistors, should be twice the difference between the magnitude of supply voltage $+V_s$ and threshold voltage $V_t$. The charging voltage $V_c$ of capacitor $C_1$ is diminished by this voltage drop $V_l$ so that, upon the subsequent switchover, the flyback potential $V_f$ of terminal F assumes the value $2\,V_s - V_l$.

Figure 2:
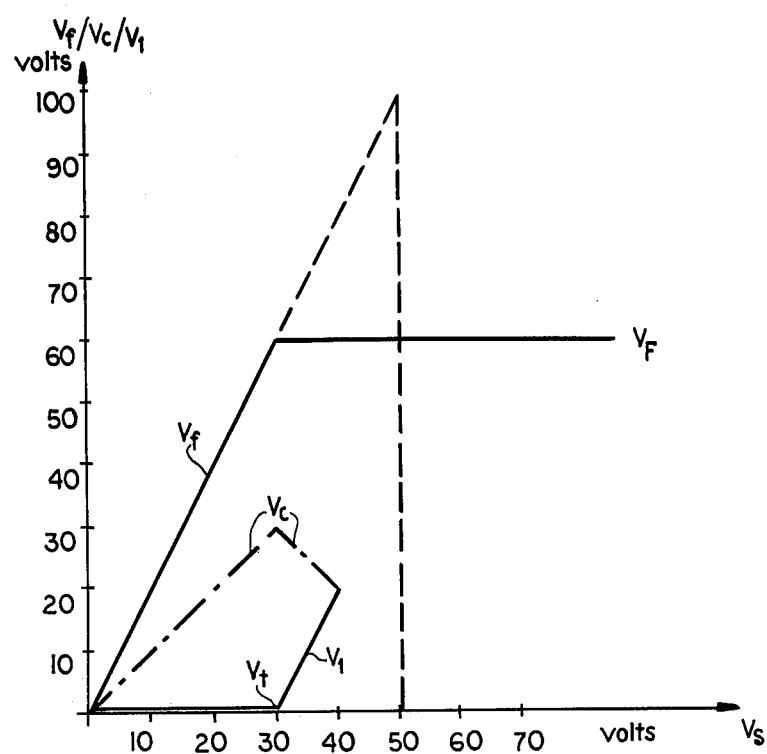
FIG. 2 is a graph serving to compare the modes of operation of such a flyback generator with and without my present improvement.

In FIG. 2 I have plotted this flyback potential $V_f$ against supply voltage $V_s$ for representative values ranging between 0 and 70 volts at terminal A. In the conventional system, lacking means for limiting the flyback potential $V_f$, the latter would rise linearly at twice the rate of supply voltage $V_s$ so as to attain, for example, a value of 100 v for $V_s = 50$ v (as indicated in dotted lines). With a threshold voltage $V_t$ according to my invention, here assumed equal to 30 v, the charging voltage $V_c$ equals the supply voltage $V_s$ only up to the point $V_s = V_t$ and then begins to drop as the voltage difference $V_l$ across charging transistor $T_8$ (FIG. 1) increases from zero (at $V_s = 30$ v) by twice the increment of the supply voltage, reaching a value of $V_l = 20$ v for $V_s = 40$ v. As a result, flyback potential $V_f$ is arrested at a limit $V_F = 2\,V_t$ here equal to 60 v.

If, in FIG. 1, transistors $T_1$ and $T_2$ are assumed to have the same base/emitter voltage $V_{be}$, the threshold $V_t$ is given by $$V_t - R_1 \left( \frac{V_t - V_{be}}{R_1 + R_2} \right) = V_{be} + V_z$$

whence $$V_t = \frac{V_z(R_1 + R_2) + V_{be} \cdot V_z}{R_2}$$

If no adjustment of the threshold is required, the external resistor $R_2$ may be replaced by one formed integral with the chip S like resistors $R_1$ and $R_3$–$R_6$ shown in FIG. 1. Obviously it would also be possible to provide for adjustability of resistor $R_1$.

Diode $D_2$ protects the base/emitter junction of transistor $T_5$ against reverse-voltage peaks in the event that, upon switchover to the flyback mode, current-mirror transistor $T_4$ is nonconductive while charging transistor $T_8$ is cut off.

Naturally, the system shown in FIG. 1 could also operate on negative supply voltages with suitable inversion of the diodes and interchange of the conductivity types of the several transistors.

I claim:

1. In a sweep system controlling the energization of a deflection coil of a cathode-ray tube during alternate scanning and flyback periods, including a storage capacitor, a charging transistor inserted between one side of said storage capacitor and a low-voltage terminal of a direct-current source, an isolating diode inserted between the other side of said storage capacitor and a high-voltage terminal of said source carrying a supply voltage $V_s$, said diode enabling said storage capacitor to charge to a voltage $V_c = V_s - V_l$ where $V_l$ is a voltage drop across said charging transistor, periodically operating switchover means for cutting off said charging transistor during each flyback period and simultaneously connecting said one side of said storage capacitor to said high-voltage terminal whereby said other side is carried to a potential $V_f = V_s + V_c$, and circuit means connecting said other side of said storage capacitor to said coil for applying said potential $V_f$ thereto during each flyback period, the combination therewith of voltage-regulating means connected across said source for controlling the construction of said charging transistor during said scanning periods in response to fluctuations of said supply voltage $V_s$ to limit said potential $V_f$ to a predetermined maximum, said voltage-regulating means comprising a current-amplifying network establishing a threshold voltage $V_t$ and maintaining said charging transistor saturated during said scanning periods as long as $V_s \leq V_t$, said network including impedance means dimensioned to make said voltage drop $V_l$ substantially equal to $2(V_s - V_t)$ upon said supply voltage $V_s$ exceeding said threshold voltage $V_t$, thereby preventing said potential $V_f$ from exceeding a value of substantially $2 V_t$.

2. The combination defined in claim 1 wherein said network comprises a plurality of parallel branches with interconnected current-mirror transistors, one of said branches including a Zener diode, another of said branches being connected to an input of said charging transistor.

3. The combination defined in claim 2 wherein said current-mirror transistors include a transistor pair cut off by said switchover means during said flyback periods for effectively open-circuiting said network.

4. The combination defined in columns 1, 2 or 3 wherein said impedance means includes an adjustable resistor.

5. The combination defined in claim 4 wherein said charging transistor, said switchover means and said current-amplifying network are realized by integrated circuitry on a common semiconductor chip.

* * * * *